United States Patent [19]
Gardner et al.

[11] Patent Number: 5,913,116
[45] Date of Patent: Jun. 15, 1999

[54] METHOD OF MANUFACTURING AN ACTIVE REGION OF A SEMICONDUCTOR BY DIFFUSING A DOPANT OUT OF A SIDEWALL SPACER

[75] Inventors: Mark I. Gardner, Cedar Creek; Jon Cheek, Round Rock, both of Tex.

[73] Assignee: Advanced Micro Devices, Austin, Tex.

[21] Appl. No.: 08/780,455

[22] Filed: Jan. 8, 1997

[51] Int. Cl.$^6$ ................................................ H01L 21/8238
[52] U.S. Cl. ................................................ 438/231; 438/548
[58] Field of Search .............................. 437/44, 160, 162, 437/164, 57, 34, 37; 438/301, 305, 231, 548

[56] References Cited

U.S. PATENT DOCUMENTS

| | | | |
|---|---|---|---|
| 4,356,623 | 11/1982 | Hunter . | |
| 4,837,179 | 6/1989 | Foster et al. | 437/44 |
| 5,024,959 | 6/1991 | Pfiester | 437/34 |
| 5,254,866 | 10/1993 | Ogoh . | |
| 5,264,380 | 11/1993 | Pfiester | 437/37 |
| 5,504,024 | 4/1996 | Hsu | 437/44 |
| 5,605,861 | 2/1997 | Appel | 437/164 |
| 5,756,383 | 5/1998 | Gardner . | |
| 5,766,965 | 6/1998 | Yoshitomi et al. . | |

FOREIGN PATENT DOCUMENTS 1-46974  2/1989  Japan .

OTHER PUBLICATIONS

S. Wolf, *Silicon Processing for the VLSI Era*, vol. 2: Processing Integration, pp. 354–363 and 436–439, copyright 1990.

*Primary Examiner*—Richard A. Booth
*Attorney, Agent, or Firm*—Merchant, Gould, Smith, Edell, Welter & Schmidt, P.A.

[57] ABSTRACT

In semiconductor device fabrication process, an active region of a semiconductor device is formed by diffusing a dopant out of a sidewall spacer. In the fabrication process, a gate electrode having a sidewall adjacent an active region is formed on a substrate and a doped spacer layer having a dopant disposed therein is formed over the substrate and gate electrode. A portion of the spacer layer is then removed to form a spacer on the sidewall of the gate electrode. The dopant in the spacer is diffused into the substrate to form a lightly-doped region in the active region of the substrate. The lightly-doped region may form an LDD region of an LDD structure.

13 Claims, 8 Drawing Sheets

Prior Art

«5,913,116»

METHOD OF MANUFACTURING AN ACTIVE REGION OF A SEMICONDUCTOR BY DIFFUSING A DOPANT OUT OF A SIDEWALL SPACER

FIELD OF THE INVENTION

The present invention is directed generally to a method of manufacturing a semiconductor device and, more particularly, to a method of forming an active region of a semiconductor device by diffusing a dopant out of a sidewall spacer.

BACKGROUND OF THE INVENTION

Over the last few decades, the electronics industry has undergone a revolution by the use of semiconductor technology to fabricate small, highly integrated electronic devices. The most common and important semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

The source/drain regions 105, illustrated in FIG. 1, are lightly-doped-drain (LDD) structures. Each LDD structure includes a lightly-doped, lower conductivity region 106 near the channel region 107 and a heavily-doped, higher conductivity region 104 typically connected to the source/drain terminal. Generally, the LDD structures are typically formed by: implanting a first dopant into active regions adjacent the gate electrode at relatively low concentration levels to form the lightly-doped regions 106; forming spacers 108 on the gate electrode; and implanting a second dopant into the active regions at higher concentration levels to form the heavily-doped regions 104. The substrate is then annealed to drive the dopant in the heavily-doped regions deeper into the substrate 106.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral and vertical dimensions of the device structure.

The depth and extent of lateral diffusion of the LDD region are important dimensions which must be scaled down as the device structure is made smaller. Lateral diffusion of the dopant used to form the LDD region shortens the effective length of the channel region and consequently limits the ability to scale down the semiconductor device. Lateral diffusion of the LDD region dopant often occurs during processing in fabrication steps subsequent to LDD region formation, including the annealing step used to drive-in the dopants of the heavily-doped, higher conductivity region. A more detailed description of LDD structures and the fabrication thereof may be found in S. Wolf, *Silicon Processing for the VLSI Era*, Vol. 2: Processing Integration, pp. 354–363 and 436–439.

SUMMARY OF THE INVENTION

Generally, the present invention relates to a semiconductor device manufacturing method in which an active region of a semiconductor device is formed by diffusing a dopant out of a sidewall spacer.

In one embodiment of the invention, a gate electrode is formed on a substrate of the semiconductor device. A doped spacer layer having a dopant disposed therein is formed on the substrate. Portions of the spacer layer are then removed to form a spacer on a sidewall of the gate electrode. The dopant in the spacer is then diffused into the substrate to form a lightly-doped region in the substrate. The lightly-doped region may form an LDD region of an LDD structure.

In another embodiment of the invention, a process of forming an active regions of a semiconductor device having a first device region of a first conductivity type and a second device region of a second conductivity type different than the first conductivity type is provided. According to this process, at least one gate electrode is formed on each of the first and second device regions. A spacer layer is then formed over the first and second device regions. A first spacer dopant of the first conductivity type is selectively implanted into a first portion of the spacer layer formed over the first device region and portions of the first spacer layer portion are removed to form a first doped spacer on a sidewall of the gate electrode formed on the first device region. A second spacer dopant of the second conductivity type is then selectively implanted into a second portion of the spacer layer formed over the second device region and portions of the second spacer layer portion are removed to form a second spacer on a sidewall of the gate electrode formed on the second device region. The first spacer dopant and second spacer dopant are diffused into the substrate with a the first spacer dopant being diffused out of the first spacer to form a first lightly-doped region in the first device region and the second spacer dopant being diffused out of the second spacer to form a second lightly-doped region in the second device region.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
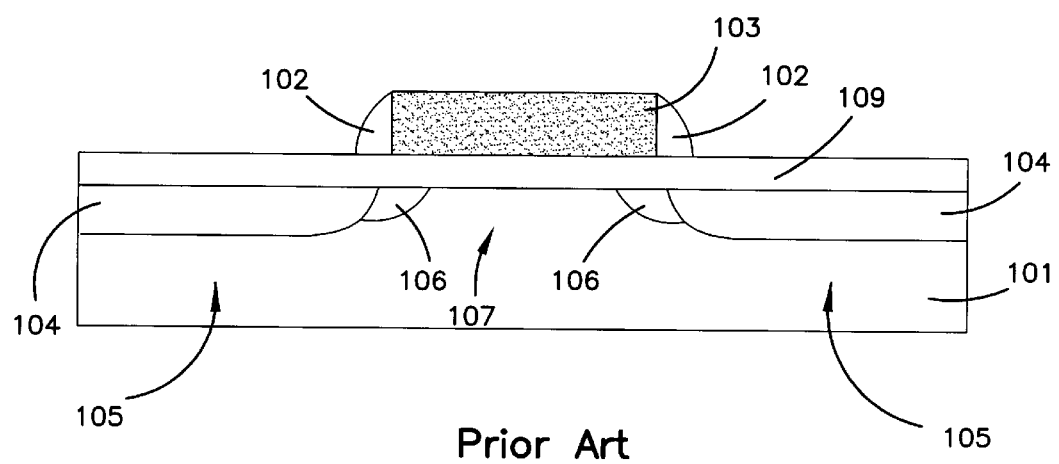
FIG. 1 illustrates one typical MOS semiconductor device structure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices, including in particular MOS structures. While the present invention is not so limited, an appreciation of various aspects of the invention will be gained through a discussion of the fabrication process and characteristics of such a device in connection with the examples provided below.

Figure 2A:
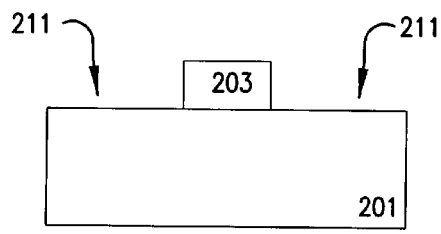
FIGS. 2A–2E illustrate a fabrication process in accordance with one embodiment of the invention.

FIGS. 2A–2E illustrate a process for fabricating a lightly-doped-drain (LDD) semiconductor device in which a lightly-doped region of the semiconductor device is formed by diffusing a dopant out of a sidewall spacer. Using known techniques, gate electrodes 203 (only one of which is shown) are formed on a substrate 201. The gate electrode 203 is typically insulated from the substrate by a thin gate oxide layer (not shown). The resultant structure is illustrated in FIG. 2A. It will be appreciated that a number of different known fabrication techniques could be used to obtain the gate electrode structure depicted as FIG. 2A.

Figure 2B:
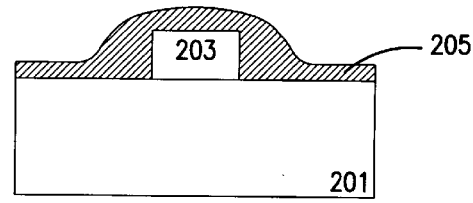
Figure 2C:
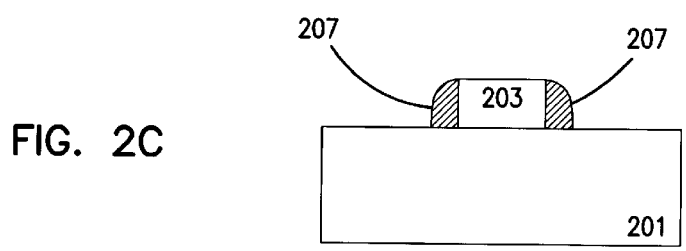

Portions of the semiconductor substrate 201 which lie adjacent the gate electrode 203 generally define active regions 211 of the substrate 201. As used herein, the term active region encompasses a region where an active portion of the device resides whether the active portion has been or will be formed. The active regions 211 may serve, for example, as source/drain regions of a semiconductor device. In the illustrative embodiment of FIGS. 2A–2E, the active regions 211 serve as LDD structures. LDD structures are illustrated in FIG. 2E.

A spacer layer 205, typically an oxide layer such as $SiO_2$, having a dopant disposed therein is formed over the substrate 201 and the gate electrode 203. The resultant structure is illustrated in FIG. 2B. The dopant may be disposed in the spacer layer 205 in a variety of manners. In one embodiment, the spacer layer 205 is first formed over the substrate 201, for example, by depositing or growing a film, and then a dopant is implanted or diffused into the film to form the spacer layer 205. In an alternate embodiment, the spacer layer 205 is formed by depositing a spacer layer material, such as $SiO_2$, and the dopant at the same time. In another embodiment, the spacer layer 205 is formed by depositing a predoped material (i.e., a material having a dopant therein). The depth of the spacer layer 205 generally varies with design parameters, such as desired channel length and gate electrode spacing. A suitable spacer layer depth typically ranges from 500 to 2000 angstroms (Å).

Portions of the spacer layer 205 are removed to form doped spacers 207 on the sidewalls of the gate electrode 203. Conventional etching techniques may be used to remove these portions of the spacer layer 203. The resultant structure, illustrated in FIG. 2C, includes doped spacers 207 containing a dopant used to form lightly-doped regions in the active regions 211 as will be described below.

Figure 2D:
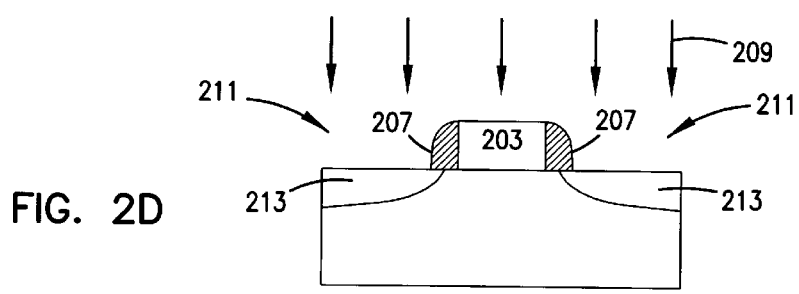
Figure 2E:
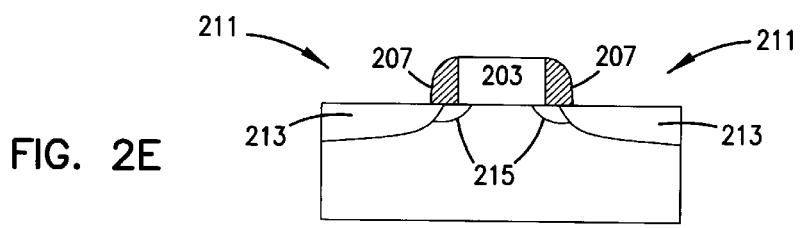

Following formation of the doped spacers 207, a source/drain dopant is implanted into the substrate, aligned with the spacers, to form heavily-doped regions 213 in the active regions 211, as illustrated in FIG. 2D. In this manner, heavily-doped regions 213, self aligned with respect to the gate electrode 203, are formed. The dopant in the doped spacers 207 is then diffused into the active regions 211 of the substrate 201 to form lightly-doped regions 215 in the active regions 211. The lightly-doped regions lie adjacent the heavily-doped regions 213 and extend below the gate electrode a short distance. Together the lightly-doped and heavily doped regions 215 and 213 form LDD structures, as illustrated in FIG. 2E. After the formation of the LDD structures, well-known processing techniques such as silicidation and interconnect formation, may be carried out to complete the device structure.

The dopant may be diffused out of the spacers 207 by heating, for example, annealing, the substrate 201. Such diffusion may be accomplished by an annealing step used in subsequent fabrication steps, such as the source/drain anneal, or by a separate heating step specifically introduced to diffuse the spacer dopant into the active region. In one embodiment, the dopant is diffused from the doped spacers 207 by rapid thermal processing, a process in which the substrate 201 is subjected to a relatively high temperature for a relatively short time, in order to finely control dopant diffusion.

Using the above process, greater control over the profile of an LDD region is provided as compared to conventional implant techniques. Moreover, shallower LDD regions and LDD regions with minimal lateral diffusion can be formed. During conventional LDD region formation, an LDD dopant is typically implanted into the substrate to a certain initial depth and lateral distance. During subsequent heating of the substrate, the dopant diffuses and penetrates both vertically and laterally into the substrate. In contrast, by diffusing a dopant from a spacer (rather than implanting a dopant into the substrate), the subsequent heating steps in the fabrication process diffuse the dopant from the substrate surface rather than from an initial implantation depth. Using the above process, it is possible to form LDD regions having depths less than 100 nm and generally ranging from about 50 nm to 100 nm. Using conventional techniques, minimum depths of 100–150 nm can be achieved.

The above process can be used to form a number of different semiconductor devices, including but not limited to MOS structures such as p-type MOS devices (PMOS), n-type MOS devices (NMOS), and complimentary MOS (CMOS) semiconductor devices having both PMOS and NMOS devices. The dopant used to dope the spacers 207 in a PMOS device is typically boron, however, other p-type dopants can be used. In NMOS devices, the spacers 207 are typically doped with arsenic or phosphorous, however, other n-type dopants can be used. Moreover, though FIGS. 2A–2E illustrate the formation of a typical LDD structure, other LDD structures, such as double implant LDDs, buried LDDs, etc., may be formed using the above-described process.

Figure 3A:
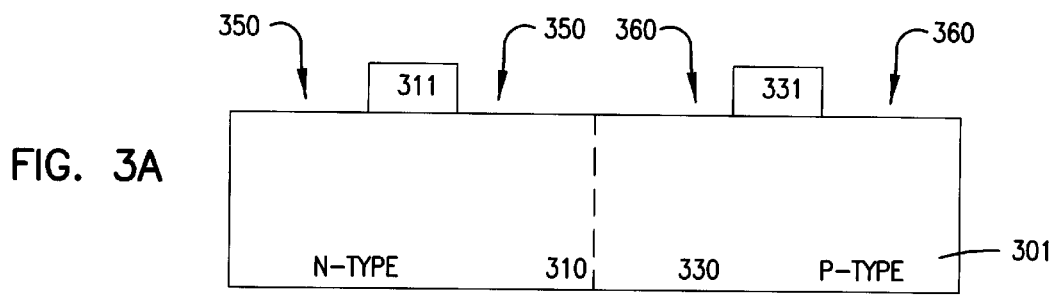
FIGS. 3A–3G illustrate another fabrication process in accordance with another embodiment of the invention.
Figure 3B:
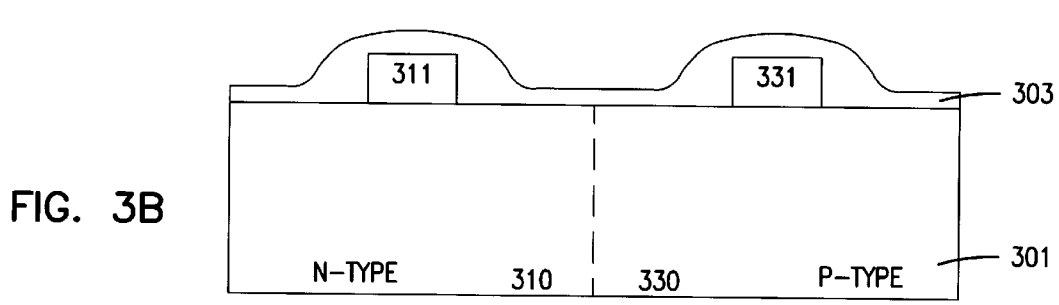
Figure 3C:
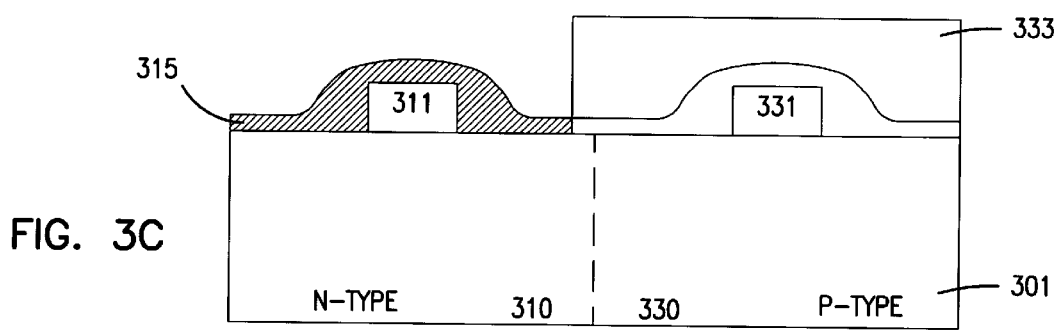
Figure 3D:
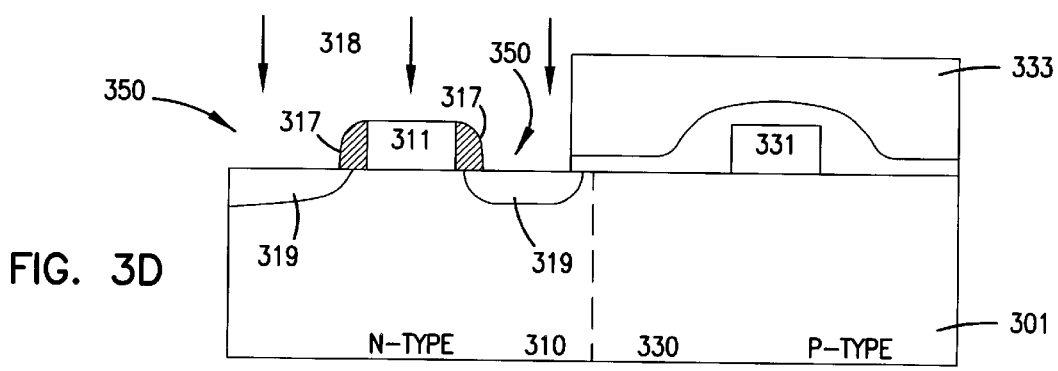
Figure 3E:
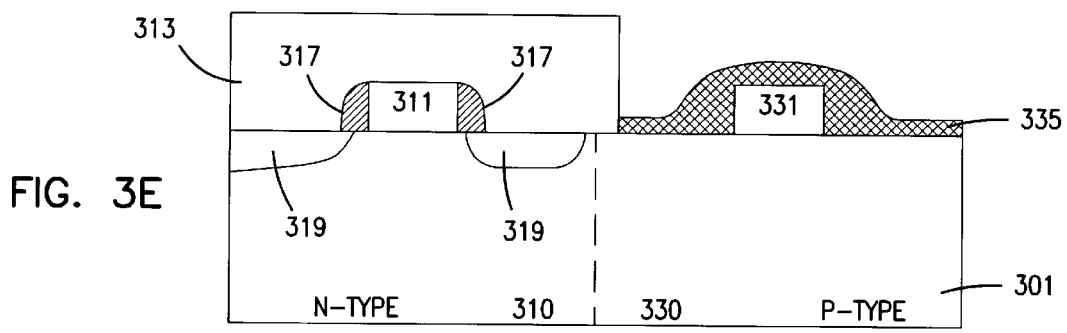
Figure 3F:
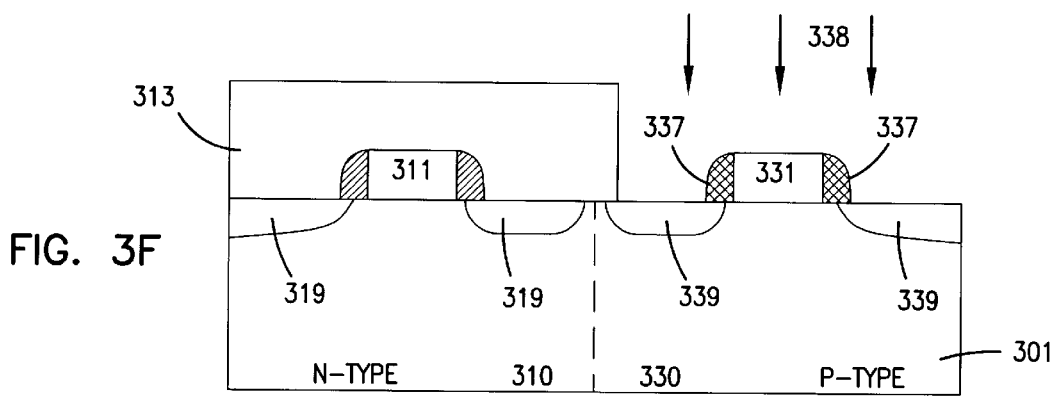
Figure 3G:
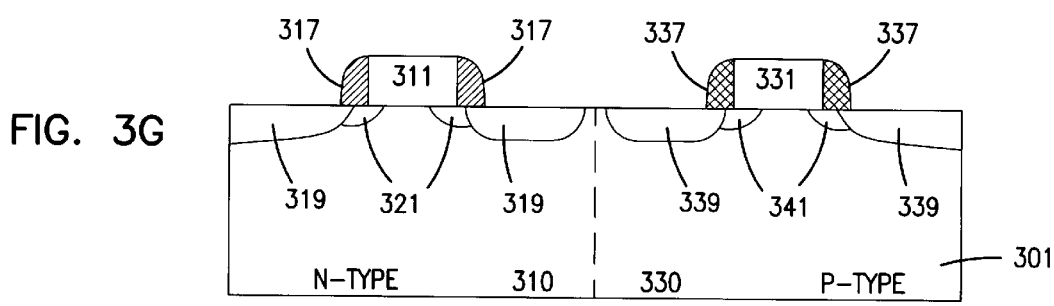

FIGS. 3A–3G illustrate another embodiment of the invention in which active regions of a semiconductor device, such as a CMOS device, are formed by diffusing a dopant out of sidewall spacers. Using known techniques, NMOS device regions and PMOS device regions are defined in a substrate 301 and gate electrodes are formed on the substrate 301 (only one gate electrode for each type of channel is shown). The gate electrodes 311 and 331 are typically insulated from the substrate by a thin gate oxide layer (not shown). Both the NMOS and PMOS device regions 310 and 330 are associated with active regions 350 and 360 respectively, which are used to form LDD structures, as illustrated in FIG. 3G. The resultant structure is illustrated in FIG. 3A.

The term device region as used herein refers to a region of the substrate associated with a MOS device having a particular type of channel. The channel type, n-type or p-type, of a channel is identified based on the conductivity type of the channel developed under the transverse electric field. This means that an NMOS device region, for example, includes an n-type channel under a transverse electric field and is associated with an n-type doped active region and gate electrode.

A spacer layer 303, typically an oxide layer such as SiO$_2$, is formed over the substrate 301 and the gate electrodes 311 and 331. The depth of the spacer layer 307 generally varies with design parameters, such as desired channel length and gate electrode spacing. A suitable spacer layer depth typically ranges from 500 to 2000 Å. The resultant structure is illustrated in FIG. 3B.

A mask 333 is formed over the PMOS device region, for example, by developing and selectively removing a photoresist. The exposed portions of the spacer layer 303 (i.e., the unmasked portion of the spacer layer 303 over the NMOS device region 310) are doped with an n-type dopant to form a doped spacer layer 315. For example, an n-type dopant such as phosphorous or arsenic may be implanted into the exposed portions of the spacer layer 303. The resultant structure is depicted in FIG. 3C.

Portions of the exposed, doped spacer layer 315 are removed to form doped spacers 317 on the sidewalls of the gate electrode 311 of the NMOS device region 310. Conventional etching techniques may be used to remove these portions of the spacer layer 303. Following formation of the doped spacers, an n-type source/drain dopant is implanted into the substrate 301, aligned with the spacer 317, to form a heavily-doped region 319 in each of the NMOS active regions 350. The resultant structure, illustrated in FIG. 3D, includes spacers 317 containing the n-type dopant on the sidewalls of the NMOS gate electrode 311. As will be described below, the doped spacers 317 are used to form lightly-doped n-type regions in the NMOS active regions 350.

The PMOS mask 333 is removed and a mask 313 is formed over the NMOS device region 310. Mask removal and formation may be done, for example, using conventional photolithographic techniques. After the NMOS mask 313 is formed, the newly exposed portion of the spacer layer 303 (i.e., the unmasked portion of the spacer layer 303 over the PMOS device region 330) is doped with a p-type dopant, such as boron, to form a p-type doped spacer layer 335. The resultant structure is depicted in FIG. 3E.

Portions of the exposed, p-doped spacer layer 335 are removed to form p-doped spacers 337 on the sidewalls of the gate electrode 331 on the PMOS device region 330. Conventional etching techniques may again be used to remove these portions of the p-doped spacer layer 335. Formation of the spacers 337 is followed by a p-type source/drain implant to form heavily-doped p-type regions 339 in the PMOS active regions 360, as illustrated in FIG. 3F. The heavily-doped p-type regions 339 are typically aligned with the gate electrode 331. The resultant structure, illustrated in FIG. 3F, includes p-doped spacers 337 on the sidewalls of the PMOS gate electrode 311 and n-doped spacers 317 on the sidewalls of the NMOS gate electrode 331.

The n-type dopant in the doped spacer 317 and the p-type dopant in the doped spacers 337 are then diffused out of the doped spacers into the substrate 301 by heating the substrate in a manner as described above. The diffused n-type dopant forms lightly-doped n-type regions 321 in the NMOS active regions 350 and the diffused p-type dopant forms lightly-doped p-type regions 341 in the PMOS active regions 360. Together the lightly-doped regions 321 and 341 and heavily-doped regions 319 and 339 form LDD structures for the two channel regions, as illustrated in FIG. 3G. The LDD structure formation may be followed by further conventional processing to complete the structure.

As discussed above, the above process allows for tight control over LDD region formation and allows shallower LDD regions and LDD regions with minimal lateral diffusion to be formed. In addition, particularly with CMOS devices, the above process eliminates the need for two conventional LDD masking steps associated with traditional LDD implants.

Though the process of FIGS. 3A–3G has been described in a manner in which the NMOS device region is developed prior to the PMOS device region, it should be appreciated that either type of channel region may be developed first, and both such processes are intended to be covered by the invention.

Figure 4A:
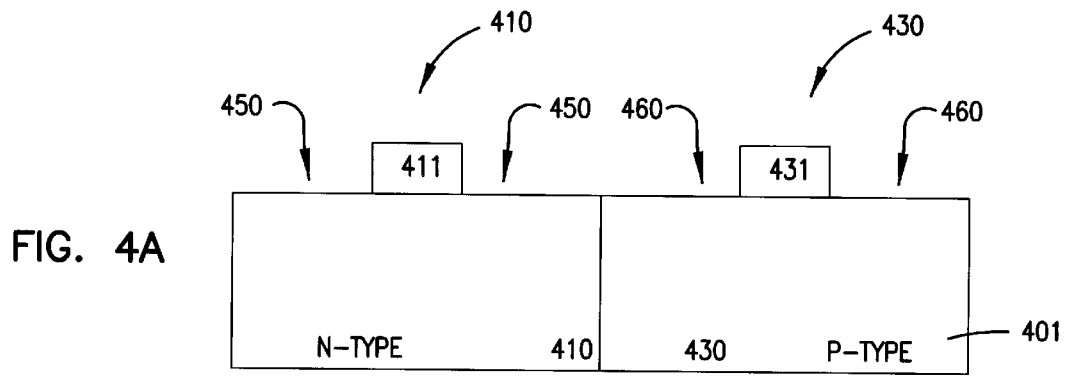
FIGS. 4A–4H illustrate another fabrication process in accordance with another embodiment of the invention.
Figure 4B:
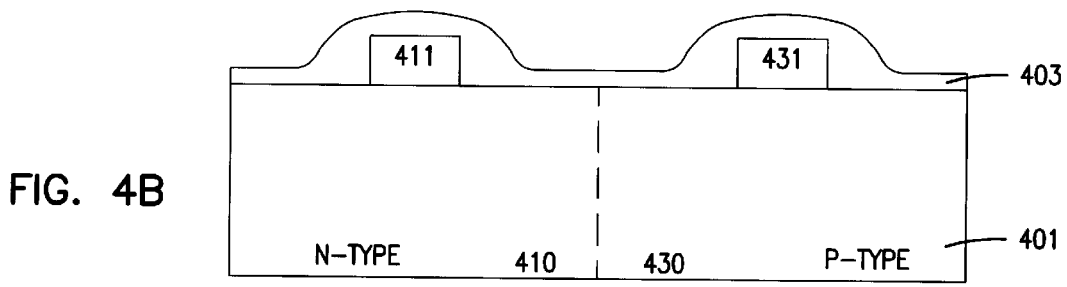
Figure 4C:
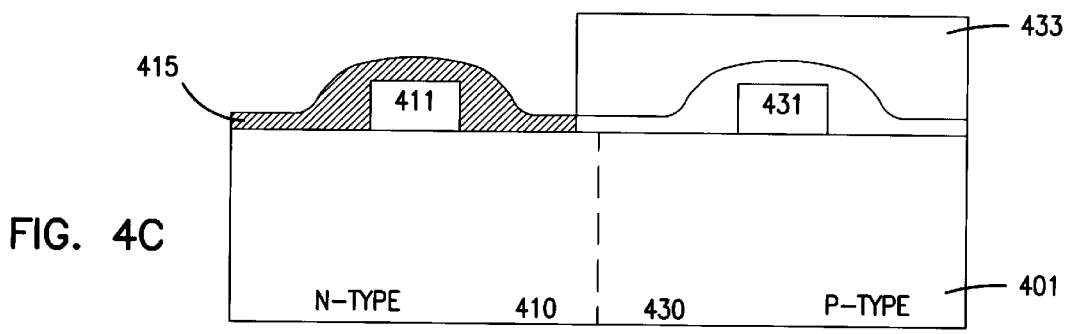
Figure 4D:
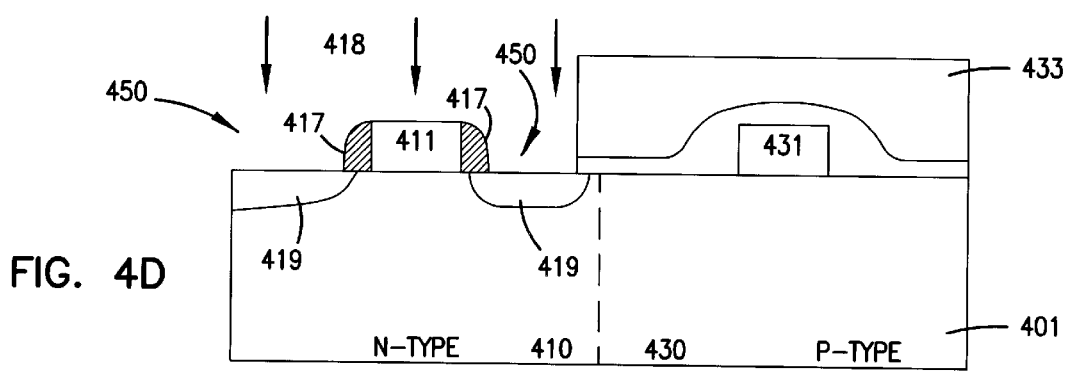
Figure 4E:
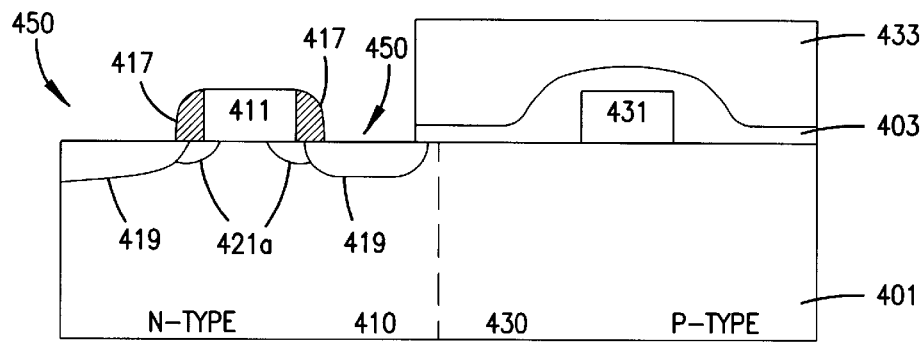
Figure 4F:
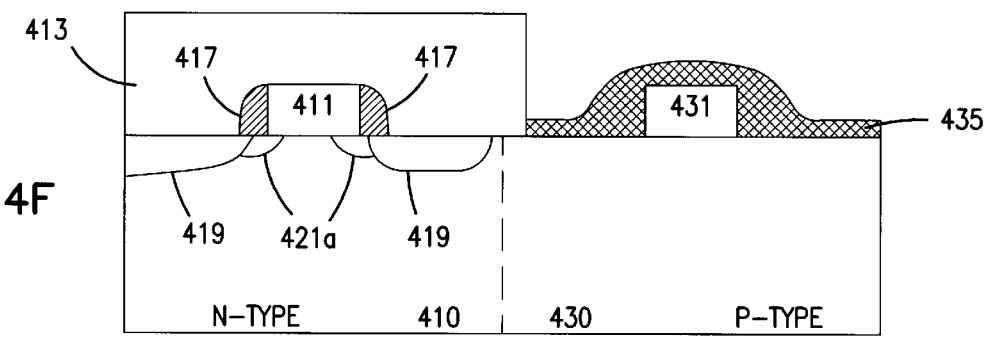
Figure 4G:
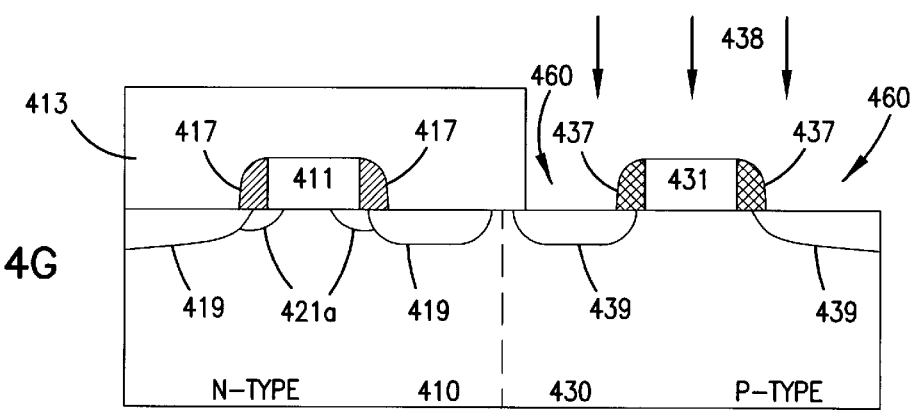
Figure 4H:
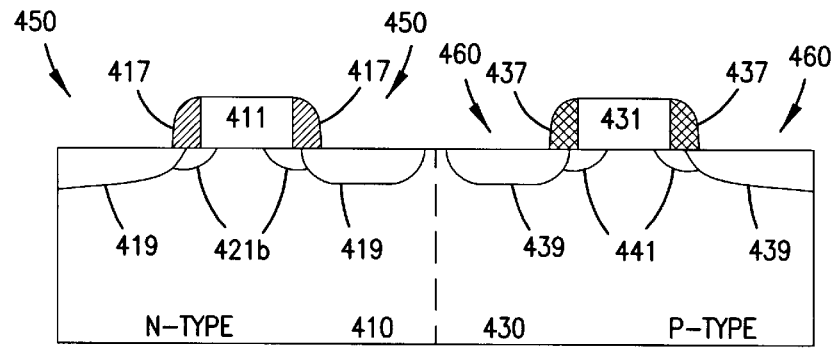

FIGS. 4A–4H illustrate another embodiment of this invention in which an active region of a semiconductor device, such as a CMOS device, is formed by diffusing a dopant out of a sidewall spacer and by using different heat treatment steps for the different channels. In this embodiment, using known techniques, NMOS device regions and PMOS device regions (only one of each type is shown) are defined and gate electrodes (only one for each channel type is shown) are formed on a substrate 401, as illustrated in FIG. 4A. The gate electrodes 411 and 431 are typically insulated from the substrate by a thin gate oxide layer (not shown). Both the NMOS and PMOS device regions 410 and 430 are associated with active regions 450 and 460 respectively, which are used to form LDD structures, as illustrated in FIG. 4H.

In a similar manner as described with respect to the process of FIGS. 3A–3G, a spacer layer 403 is formed over the substrate 401 and the gate electrodes 411 and 431, as illustrated in FIG. 4B. A mask 433 is formed over the PMOS device region 430 and the exposed portion of the spacer layer 403 is doped with an n-type dopant to form a doped spacer layer 415. The resultant structure is depicted in FIG. 4C. Portions of the doped spacer layer 415 are removed to form n-doped spacers 417 on the sidewalls of the NMOS gate electrode 411 and an n-type source/drain implant is performed to form heavily-doped regions 419 in the NMOS active region 450, as described above. The resultant structure illustrated in FIG. 4D includes n-doped spacers 417 containing the n-type dopant formed on the sidewalls of the NMOS gate electrode 411.

The n-type dopant in the spacers 417 is then diffused out of the spacers 417 into the substrate by heating or annealing the substrate 401 to form first lightly-doped n-type regions 421a in the NMOS active regions 450. This heating step may include rapid thermal processing in which the substrate 401 is subjected to a relatively high temperature for a relatively short time in order to more precisely control the outdiffusion of the dopant from the spacers 417. This heating step prior to the formation of the p-type lightly-doped regions is particularly advantageous when an atom which diffuses more slowly than the p-type dopant, such as a heavy atom like arsenic, is used as the n-type dopant. This intermediate heating step diffuses a heavy n-type dopant to a shallow depth such that during subsequent heating, as discussed below, the resultant profiles of the NMOS lightly-doped regions and PMOS lightly-doped regions can be independently controlled, and if desired can be made approximately equivalent.

The PMOS mask 433 is removed, a mask 413 is formed over the NMOS device region 410, and the newly exposed spacer layer 403 over the PMOS device region 430 is doped to form a doped spacer layer 435, as discussed above. The resultant structure is depicted in FIG. 4F. Portions of the doped spacer layer 435 are removed to form p-doped spacers 437 on the sidewalls of the PMOS gate electrode 431, and a p-type source/drain implant is performed to form heavily-doped regions 439 in the PMOS active regions 460, as discussed above. The resultant structure as illustrated in FIG. 4G includes a PMOS device region 330 having p-doped spacers 437 on the sidewalls of the PMOS gate electrode 411 and an NMOS device region 330 having n-doped spacers 417 on the sidewalls of the NMOS gate electrode 431 as well as a shallow lightly-doped region 421a.

The n-type and p-type dopants in the spacers 417 and 437 are then diffused out of the spacers into the substrate 401. Again, the n-type and p-type dopants may be diffused out of the spacers 417 and 437 by heating the substrate 401 in a manner discussed above. With respect to the NMOS device region, the n-type dopant diffused into the substrate during the earlier heating step further diffuses into the substrate thereby effectively increasing the depth of the first lightly-doped regions 421a, to form slightly deeper yet shallow lightly-doped regions 421b in the NMOS active regions 450. The p-type dopant is diffused to form lightly-doped p-type regions 441 in the PMOS active regions 460. By subjecting the different channel types to different thermal processes, the lightly-doped regions 421b and 441 may be formed having about the same depth, if desired. Together the lightly-doped regions 421b and 441 and heavily doped regions 419 and 439 form LDD structures for the respective channel regions, as illustrated in FIG. 4H.

As discussed above, the above process provides tighter control over LDD region formation and allows shallower LDD regions and LDD regions with less lateral diffusion to be formed. In addition, particularly with CMOS devices, the above process eliminates the need for two conventional LDD masking steps associated with conventional LDD implants. Moreover, by using different thermal processes on the NMOS and PMOS device regions, the resultant profiles of the NMOS and PMOS lightly-doped regions can be independently controlled, and if desired can be made approximately equivalent (even if the p-type dopant diffuses more rapidly than the n-type dopant).

Figure 5A:
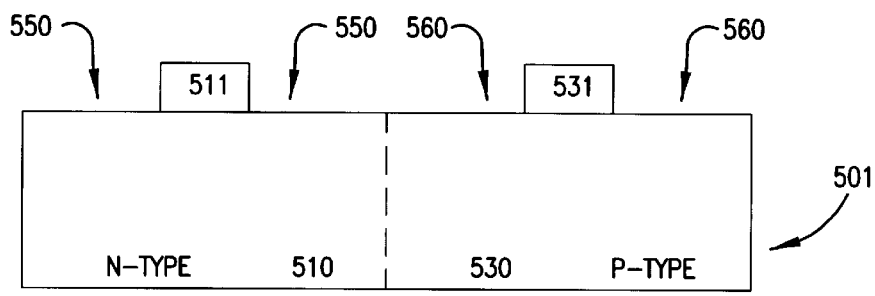
FIGS. 5A–5G illustrate still another fabrication process in accordance with another embodiment of the invention.
Figure 5B:
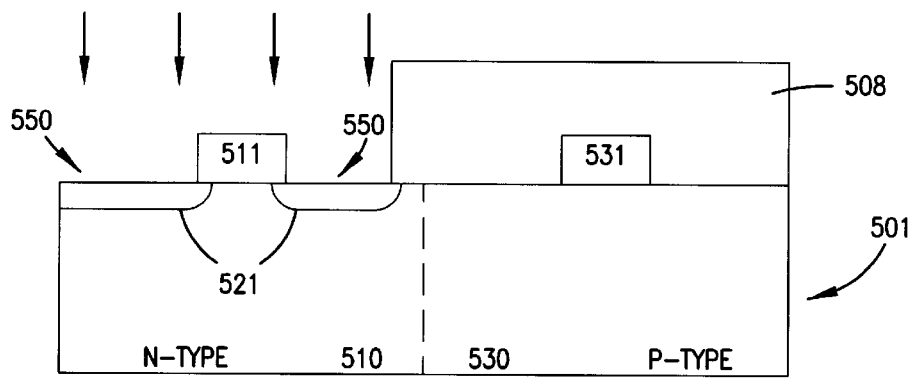
Figure 5C:
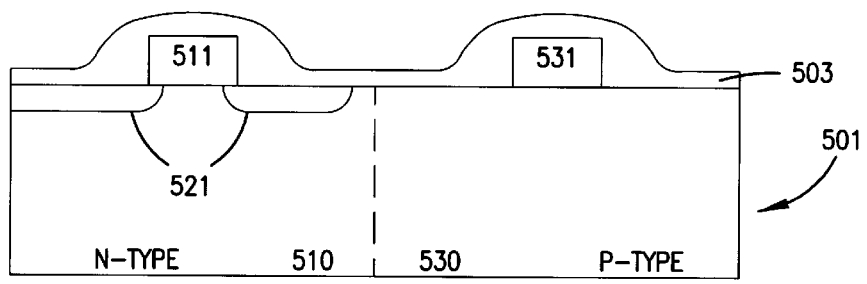
Figure 5D:
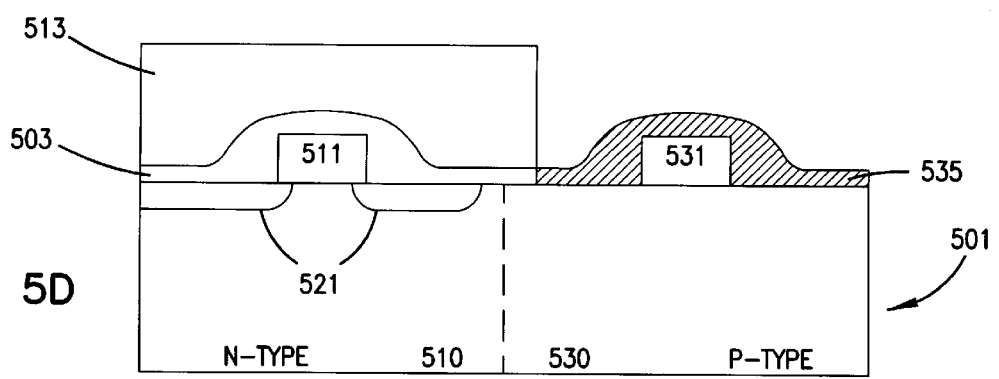
Figure 5E:
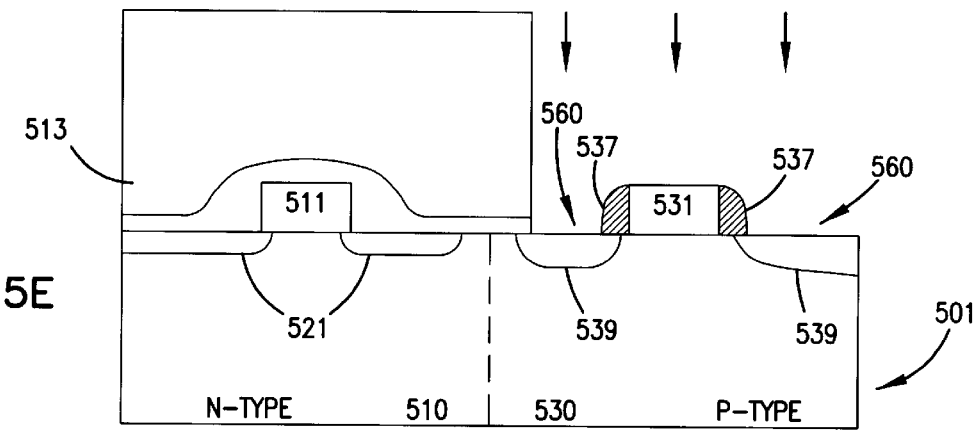
Figure 5F:
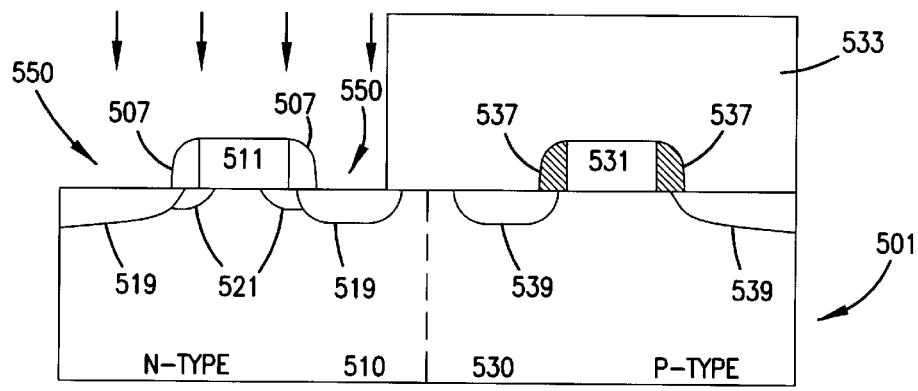
Figure 5G:
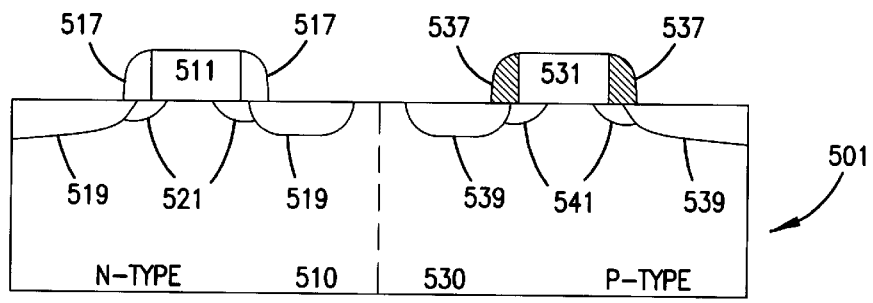

FIGS. 5A–5G illustrate another embodiment of this invention in which an active region of a semiconductor device, such as a CMOS device, is formed by diffusing a dopant out of a sidewall spacer on only one of the channel types. Again, using well-known techniques, NMOS and PMOS device regions are defined and gate electrodes are formed on a substrate 501, as illustrated in FIG. 5A. The gate electrodes 511 and 531 are typically insulated from the substrate by a thin gate oxide layer (not shown). Both the NMOS and PMOS device regions 510 and 530 are associated with active regions 550 and 560 respectively, which are used to form LDD structures, as illustrated in FIG. 5G.

Using well-known techniques, a mask 508 is formed over the PMOS device region 530 and an LDD implant is performed to form NMOS LDD regions 521 in the NMOS active regions 550. The NMOS LDD regions 521 typically are formed by using the gate electrode 531 to align the implantation in the substrate 501. The resultant structure is shown in FIG. 5B.

The mask 508 over the PMOS device region 530 is removed using conventional techniques, and a spacer layer 503 is formed over the substrate 501 and the gate electrodes 511 and 531, as illustrated in FIG. 5C. In a similar manner to that described with respect to the process of FIGS. 3A–3G, a mask 513 is formed over the NMOS device region 510 and the exposed spacer layer 503 over the PMOS device region 530 is doped with a p-type dopant to form a doped spacer layer 535, as depicted in Figure 5D. Portions of the doped spacer layer 535 are then removed to form doped spacers 537 on the sidewalls of the gate electrode 531 of the PMOS device region 530 and a p-type source/drain implant is performed to form heavily-doped regions 539 in the PMOS active regions 560, as described above. The resultant structure, illustrated in FIG. 5E, includes p-doped spacers 537 on the sidewalls of the PMOS gate electrode 531.

The NMOS mask 513 is removed, a mask 533 is formed over the PMOS device region 530, and portions of the newly exposed spacer layer 50S over the NMOS device region 510 are removed to form spacers 517 on the sidewalls of the NMOS gate electrode 511. An n-type source/drain implant is performed to form heavily-doped regions 519 in the NMOS active regions 550. In the resultant structure illustrated in FIG. 5G, the PMOS device region 530 includes p-doped spacers 537 on the sidewalls of the PMOS gate electrode 531 for forming PMOS LDD regions as will be discussed, while the NMOS device region 510 includes NMOS LDD regions 521 already formed by the earlier LDD implant, as discussed above.

The p-type dopant in the spacers 537 is then diffused into the substrate to form PMOS lightly-doped regions 541, such as LDD regions, in the PMOS active regions 560 as described above. Again, the p-type dopant may be diffused out of the spacers 537 by heating or annealing the substrate 501, for example, by rapid thermal processing. The resultant structure is illustrated in FIG. 5G. At this point, conventional process steps, such as silicidation and interconnect formation, may be carried out to complete the device structure.

Using the above process, lateral diffusion of the dopants used to form NMOS and PMOS LDD regions is reduced and smaller semiconductor devices can be formed. Typically, lateral diffusion of the PMOS LDD region dopant is difficult to reduce since conventional LDD implants use a boron dopant which diffuses rapidly. The above process reduces lateral diffusion of the PMOS LDD region dopant since the PMOS LDD dopant is diffusion from the surface of the substrate rather than implanted to an initial depth (and an initial amount of lateral diffusion) within the substrate as would be the case with after a conventional LDD implant. With regard to the NMOS LDD region, by using an n-type dopant, such as arsenic or phosphorous, which diffuses more slowly than, for instance, a boron dopant, lateral diffusion of the NMOS device region dopant is also reduced.

As noted above, the present invention is applicable to the fabrication of a number of different devices where an LDD region of an active region is formed by diffusing a dopant out of a spacer. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process of forming a semiconductor device having a first device region of a first conductivity type and a second device region of a second conductivity type different than the first conductivity type, the process comprising:

forming at least one gate electrode on each of the first and second device regions;

forming a spacer layer over the first and second device regions;

selectively implanting a first spacer dopant, of the first conductivity type, into a first portion of the spacer layer formed over the first device region;

removing a portion of the first spacer layer portion to form a first doped spacer on a sidewall of the gate electrode formed on the first device region;

selectively implanting a second spacer dopant, of the second conductivity type, into a second portion of the spacer layer formed over the second device region;

removing a portion of the second spacer layer portion to form a second doped spacer on a sidewall of the gate electrode formed on the second device region; and diffusing the first spacer dopant and second spacer dopant into the substrate, the first spacer dopant being diffused out of the first doped spacer to form a first lightly-doped region in an active region of the first device region and the second spacer dopant being diffused out of the second doped spacer to form a second lightly-doped region in an active region of the second device region.

2. The process of claim 1, wherein the diffusing includes heating the substrates.

3. The process of claim 2, wherein the heating includes rapid thermal processing.

4. The process of claim 1, further including diffusing at least a portion of the first spacer dopant out of the first doped spacer into the active region of the first device region prior to selectively implanting the second spacer dopant.

5. The process of claim 1, wherein selectively implanting the first spacer dopant comprises:

forming a mask over the second device region; and implanting the first spacer dopant into the first portion of the spacer layer while the mask is over the second device region.

6. The process of claim 1, wherein selectively implanting the second spacer dopant comprises:

forming a mask over the first device region; and implanting the second spacer dopant into the second portion of the spacer layer while the mask is over the first device region.

7. The process of claim 1, wherein forming the spacer layer comprises depositing an oxide on the substrate.

8. The process of claim 1, wherein the spacer layer has a thickness of about 500 to 2,000 angstroms.

9. The process of claim 1, wherein the first spacer dopant comprises an arsenic containing species.

10. The process of claim 1, wherein the first spacer dopant comprises a phosphorous containing species.

11. The process of claim 1, wherein the second spacer dopant comprises a boron containing species.

12. The process of claim 1, further including doping the active region of the first device region with a source/drain dopant of the first conductivity type to form a heavily-doped region in the active region of the first device region.

13. The process of claim 1, further including doping the active region of the second device region with a source/drain dopant of the second conductivity type to form a heavily-doped region in the active region of the second device region.

* * * * *